(12) United States Patent
Tan et al.

(10) Patent No.: US 8,941,408 B2
(45) Date of Patent: Jan. 27, 2015

(54) CONFIGURING DATA REGISTERS TO PROGRAM A PROGRAMMABLE DEVICE WITH A CONFIGURATION BIT STREAM WITHOUT PHANTOM BITS

(71) Applicant: Altera Corporation, San Jose, CA (US)

(72) Inventors: Jun Pin Tan, Selangor (MY); Kiun Kiet Jong, Pulau Pinang (MY)

(73) Assignee: Altera Corporation, San Jose, CA (US)

( * ) Notice: Subject to any disclaimer, the term of this patent is extended or adjusted under 35 U.S.C. 154(b) by 58 days.

(21) Appl. No.: 13/780,526

(22) Filed: Feb. 28, 2013

(65) Prior Publication Data

US 2014/0240000 A1 Aug. 28, 2014

(51) Int. Cl.
*H03K 19/177* (2006.01)
*G06M 3/00* (2006.01)
*H03K 19/0175* (2006.01)

(52) U.S. Cl.
CPC .............................. *H03K 19/017581* (2013.01)
USPC .................................. 326/38; 326/41; 377/26

(58) Field of Classification Search
USPC ....................................................... 326/38–41
See application file for complete search history.

(56) References Cited

U.S. PATENT DOCUMENTS

| 5,426,379 | A | 6/1995 | Trimberger |
| 5,773,993 | A * | 6/1998 | Trimberger ..................... 326/38 |
| 6,748,456 | B1 * | 6/2004 | Stanton et al. .................... 710/1 |
| 6,981,153 | B1 | 12/2005 | Pang et al. |
| 7,028,281 | B1 * | 4/2006 | Agrawal et al. ................. 326/41 |
| 7,103,685 | B1 | 9/2006 | Trimberger |
| 7,230,445 | B1 * | 6/2007 | Goetting et al. .................. 326/9 |
| 7,822,958 | B1 * | 10/2010 | Allen et al. ....................... 713/1 |
| 8,040,152 | B1 | 10/2011 | Han |

OTHER PUBLICATIONS

Office Action mailed Mar. 25, 2014, for U.S. Appl. No. 13/781,350.
Final Office Action mailed Jun. 11, 2014, for U.S. Appl. No. 13/781,350.
Notice of Allowance mailed Aug. 5, 2014, for U.S. Appl. No. 13/781,350.

* cited by examiner

*Primary Examiner* — Vibol Tan
(74) *Attorney, Agent, or Firm* — Weaver Austin Villeneuve & Sampson LLP

(57) ABSTRACT

Techniques and mechanisms dynamically configure shift registers among registers composing data registers in a circuit such as a Programmable Logic Device (PLD). A configuration bit stream used to configure the PLD may have a reduced size if "phantom bits" not corresponding to configuration elements are removed. Shift registers may be dynamically configured such that registers which do not correspond to physical configuration elements may be skipped. Thus, a PLD may be programmed with a configuration bit stream without phantom bits.

18 Claims, 16 Drawing Sheets

CONFIGURING DATA REGISTERS TO PROGRAM A PROGRAMMABLE DEVICE WITH A CONFIGURATION BIT STREAM WITHOUT PHANTOM BITS

TECHNICAL FIELD

The present disclosure generally relates to integrated circuits. More specifically, the present disclosure relates to systems and methods for configuring a circuit using a configuration bit stream.

DESCRIPTION OF RELATED ART

A PLD is a semiconductor integrated circuit which contains logic circuitry and routing that may be configured to perform a host of logic functions. In a typical scenario, a designer uses electronic design automation (EDA) tools to create a design. The EDA tools create a configuration bit stream corresponding to the design. The configuration bit stream is used to configure or program configuration elements within the PLD in order to implement the desired functionality and routing. Configuration elements may include non-volatile memories (e.g., flash, antifuses, fuses) and/or volatile memories (e.g., static random-access memory (SRAM)) distributed throughout the PLD.

If the configuration elements are non-volatile memories, the configuration elements must be configured according to the configuration bit stream upon power-up of the PLD. Conventionally, bits from the configuration bit stream are loaded group-by-group into Data Registers. After the Data Registers are loaded with a group of bits, Address Registers are used to program or configure a particular group (e.g., a single column) of configuration elements corresponding to the bits in the configuration bit stream that are loaded into the Data Registers. However, not all of the locations created by the Data Registers and Address Registers correspond to a physical configuration element. Accordingly, a plurality of "phantom bits" which do not correspond to a physical configuration element, but which are still needed to properly load the Data Registers, are distributed throughout the configuration bit stream.

Removal of the phantom bits may reduce the size of the configuration bit stream. Reducing the size of the configuration bit stream provides a multitude of advantages. Reduction of the configuration bit stream allows a smaller memory device to be used to store the configuration bit stream for PLDs with non-volatile configuration elements. For example, a PLD with on-chip flash storage to hold the configuration bit stream may require less flash memory to store the configuration bit stream. Using less flash memory may lead to higher yield rates, and therefore, reduced costs. Additionally, reducing the configuration bit stream size may allow multiple configuration bit streams to be stored in the same storage device. The multiple designs may be used in dual booting or partial reconfiguration of the PLD.

Conventional methodologies to reduce the size of the configuration bit stream are limited. For example, the configuration bit stream may be compressed and stored. However, compression is dependent upon the pattern of "1's" and "0's" in the configuration bit stream. Because different designs will have different configuration bit streams with different patterns, compression ratios for configuration bit streams will vary. Accordingly, a worst case compression ratio must be used in order to determine a flash memory size to store the configuration bit stream. Additionally, a compressed bit stream must be decompressed before configuring the PLD, a process which may significantly increase the total configuration time.

SUMMARY

The techniques and mechanisms of the present disclosure dynamically configure shift registers among registers composing data registers in a circuit, such as PLDs (including FPGAs, CPLDs, etc.), structured ASICs, ASICs, and other types of devices. The invention is primarily described with reference to PLDs as an example of a configurable circuit, but is not necessarily limited to PLDs.

The present invention provides improved mechanisms for using a smaller configuration bit stream which may be used to configure the PLD. In one example, a control block may receive a configuration bit stream without "phantom bits" which do not correspond to physical configuration elements. The control block may dynamically configure shift registers among the data registers such that the configuration bits may be properly loaded into the configured shift registers. Accordingly, the PLD may be configured. For instance, the control block may receive information from a header portion of the configuration bit stream including information regarding configuration bits. The control block may configure multiple shift registers of particular lengths and locations among the data registers such that registers which do not correspond to physical configuration elements may be skipped, and therefore, not part of a configured shift register. Thus, a configuration bit stream without phantom bits may be used to configure the PLD.

These and other features will be presented in more detail in the following specification of the invention and the accompanying figures, which illustrate by way of example the principles of the invention.

BRIEF DESCRIPTION OF THE DRAWINGS

The invention may best be understood by reference to the following description taken in conjunction with the accompanying drawings, which illustrate specific embodiments of the present invention.

DETAILED DESCRIPTION OF PARTICULAR EMBODIMENTS

Figure 1:
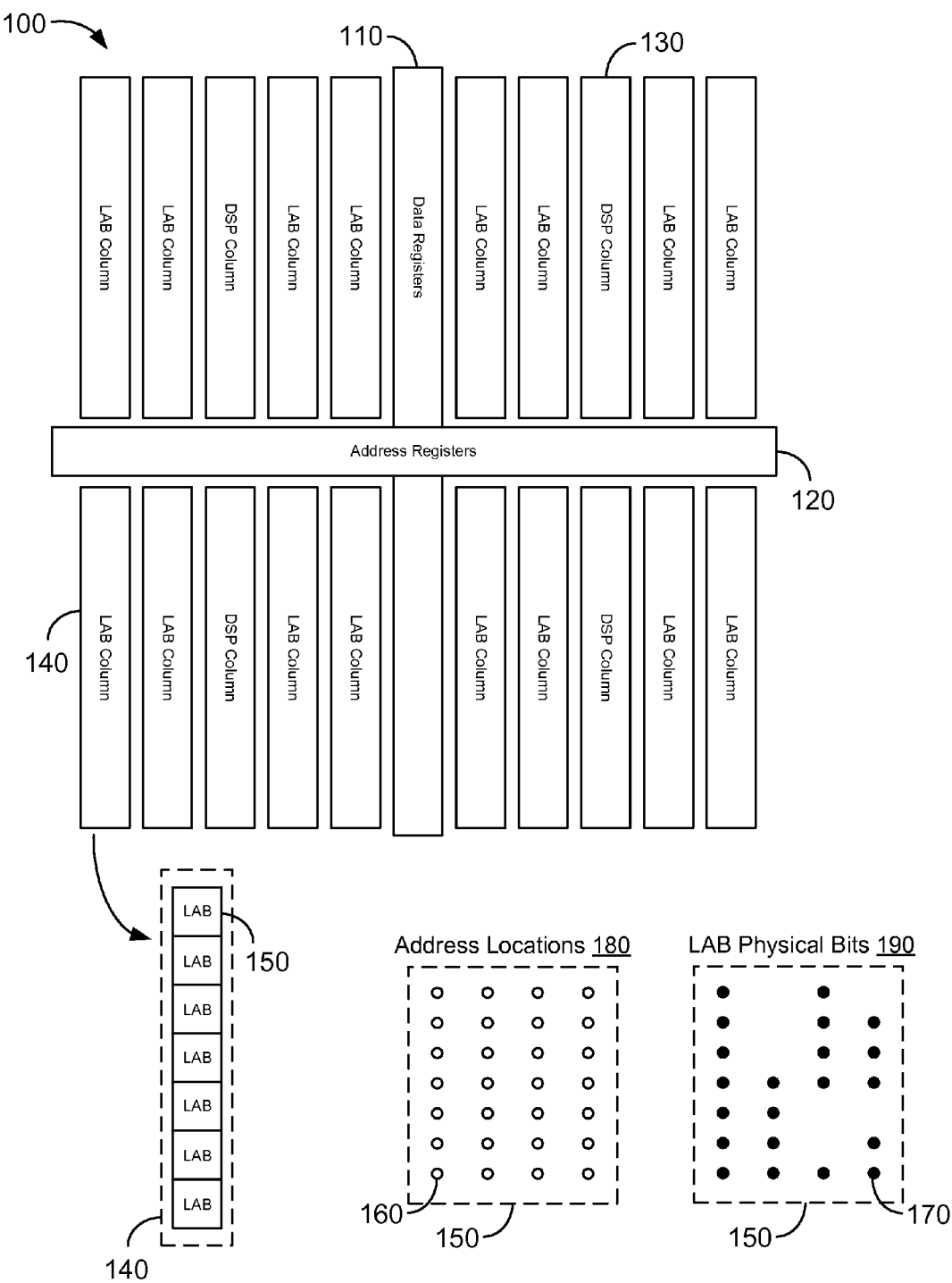
FIG. 1 illustrates one example of a design of a PLD and distributions of address locations and physical configuration elements for a particular resource type according to an exemplary embodiment.

FIG. 1 is an example of a schematic of a programmable logic device (PLD) that may be configured with a configuration bit stream. In an implementation, PLD 100 includes a plurality of columns arranged across 2 rows. Each column may contain a certain resource type. For example, in FIG. 1, DSP Column 130 may contain a plurality of resources, each corresponding to a digital signal processing (DSP) module.

In an implementation, LAB Column 140 may also contain a plurality of resources, each corresponding to a different resource type than DSP Column 130. LAB Column 140 may contain a plurality of logic array blocks (LABs), wherein each individual LAB contains a plurality of logic elements which may implement a variety of functions and/or routing. For example, in FIG. 1, LAB Column 140 may further include 7 LAB blocks, including LAB 150.

PLD 100 may also include Data Registers 110 along a vertical axis, and Address Registers 120 along a horizontal axis. In various implementations, the locations and orientations of Data Registers 110 and Address Registers 120 may be different. For example, Data Registers 110 may be oriented along the left or right sides of the PLD rather than through the middle and Address Registers 120 may be on the top or bottom sides of the PLD rather than through the middle of the PLD. In an implementation, the Data Registers 110 and Address Registers 120 may be switched such that Data Registers 110 is oriented along the horizontal axis and Address Registers 120 is oriented along the vertical axis.

Accordingly, Data Registers 110 and Address Registers 120 may be visualized as providing a coordinate system throughout the PLD. For example, in FIG. 1, Data Registers 110 may provide y-coordinates and Address Registers 120 may provide x-coordinates. In various implementations, the coordinate system may include the core or array of the PLD as well as periphery circuitry (e.g., I/Os, PLLs, etc.), memory devices (e.g., SRAM units on a PLD), etc. Accordingly, a variety of locations within the PLD may be addressed via the coordinate system provided by Data Registers 110 and Address Registers 120. The locations may correspond to configuration elements which may need to be programmed or configured in order to implement specific functionalities within the PLD.

However, in an implementation, not all of the locations provided by the coordinate system may be utilized. For example, a subset of the locations provided by the coordinate system may correspond with configuration elements such as configuration random access memory (CRAM) cells, which are configured to provide specified functionality, within a PLD. But, not all of the address locations provided by the coordinate system may correspond to a CRAM cell due to design considerations such as physical design issues (e.g., design, locations, sizes, design rules, etc. regarding metal layers, vias, contacts, and other elements of a physical layout design).

For example, referring back to LAB 150 of FIG. 1, a plurality of Address Locations 180 may correspond to LAB 150. The address locations, each represented by an empty circle such as Address Location 160, are available at all x,y coordinates. However, not all of the address locations correspond to a physical CRAM cell. LAB Physical Bits 190 illustrates a distribution of physical CRAM cells within LAB 150. LAB Physical Bits 190 shows that LAB 150 includes columns of CRAM cells. Physical CRAM cells, each represented by a solid circle such as CRAM cell 170, may be a subset of Address Locations 180. As such, several address locations do not correspond to an existing CRAM cell for LAB 150.

Figure 2:
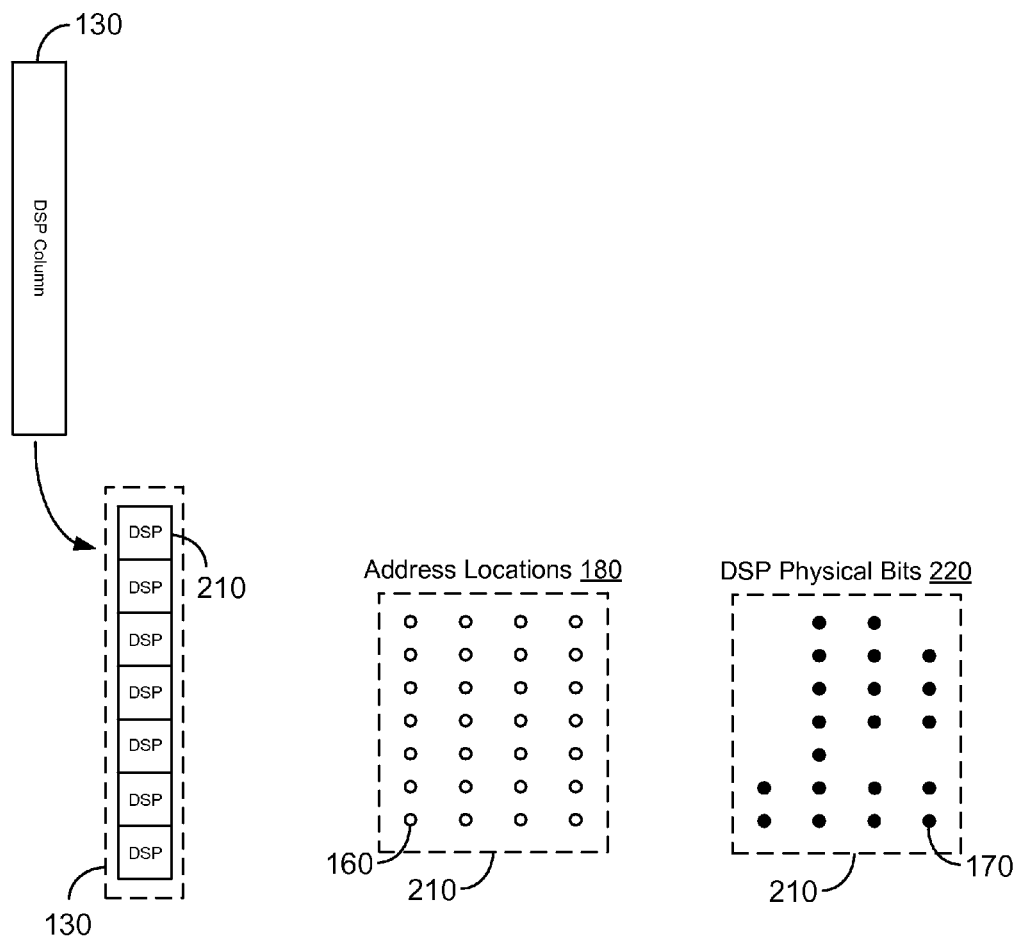
FIG. 2 illustrates another example of distributions of address locations and physical configuration elements for a different resource type according to an exemplary embodiment.

Additionally, in some implementations, different resource types (i.e., different types of modules such as DSP Modules, LAB Modules, memory modules, I/Os and other periphery circuitry, etc.) may have a different distribution of CRAM cells. FIG. 2 illustrates an example of the distribution of CRAM cells for DSP Column 130, which differs from the distribution of CRAM cells for LAB Column 140, as previously described. In FIG. 2, DSP Column 130 of FIG. 1 may include a plurality of DSP modules, including DSP Module 210. As previously discussed, DSP Module 210 also has a plurality of Address Locations 180 corresponding to the coordinate system provided by Data Registers 110 and Address Registers 120. DSP Physical Bits 220 illustrates a distribution of physical CRAM cells within DSP Module 210. DSP Physical Bits 220 shows that DSP 210 includes columns of CRAM cells. Physical CRAM cells, each represented by a solid circle such as CRAM cell 170, are also a subset of Address Locations 180. Just as with LAB 150 of FIG. 1, DSP Module 210 also has several address locations which do not correspond to an existing CRAM cell. However, the distribution of CRAM cells within DSP Module 210 differs from the distribution of CRAM cells within LAB 150.

Figure 3A:
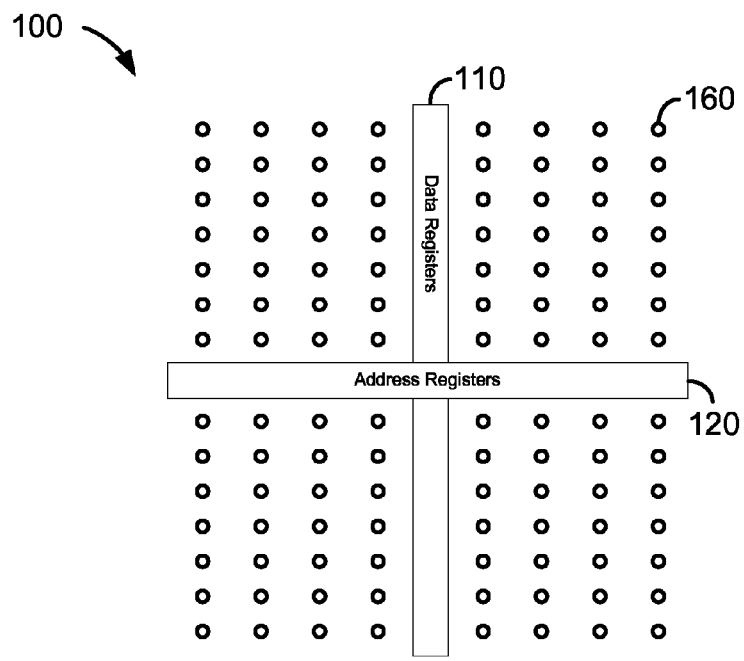
FIG. 3A illustrates an example of a distribution of address locations within a PLD according to an exemplary embodiment.

Thus, in one implementation as shown in FIG. 3A, PLD 100 may include a "sea" of coordinates or address locations, such as Address Location 160, the coordinates or address locations provided by Data Registers 110 and Address Registers 120.

Figure 3B:
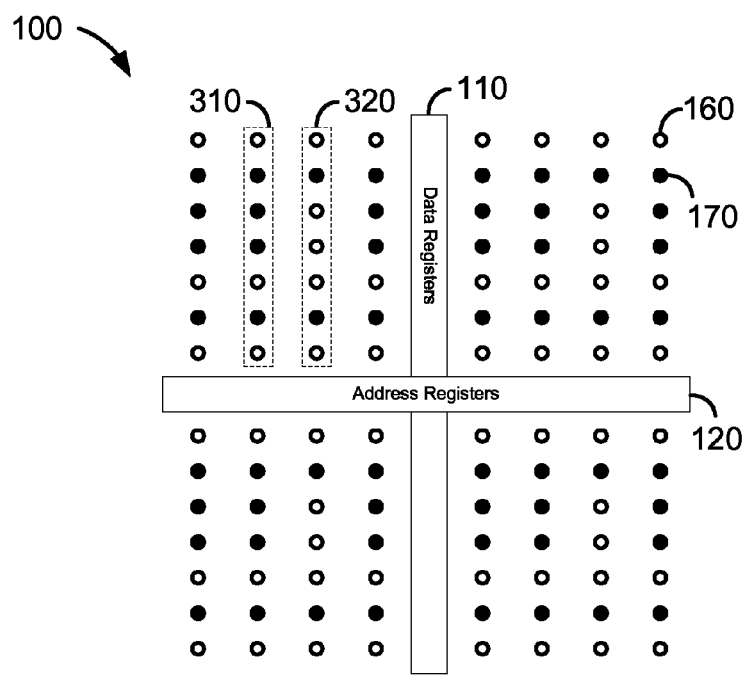
FIG. 3B illustrates an example of a distribution of address locations and physical configuration elements within a PLD according to an exemplary embodiment.

Additionally, in one implementation as shown in FIG. 3B, a subset of the coordinates or address locations are associated with physically-existing CRAM cells, such as CRAM cell 170. Moreover, each column may have a different distribution of physically-existing CRAM cells due to columns containing different resource types. For example, in the simplified implementation of FIG. 3B, Column 310 may include one type of resource type, such as DSP Modules, while Column 320 may contain a different type resource type, such as LAB Modules. Because DSP Modules and LAB modules have different functionalities and physical layouts, the distribution of physically-existing CRAM cells within each of these resource types also differs. As such, Column 310 has a different distribution of CRAM cells than Column 320.

Thus, a coordinate system of a PLD has more address locations than actual CRAM cells. Additionally, different resource types utilized within the PLD may have different distributions of physical CRAM cells.

Figure 4:
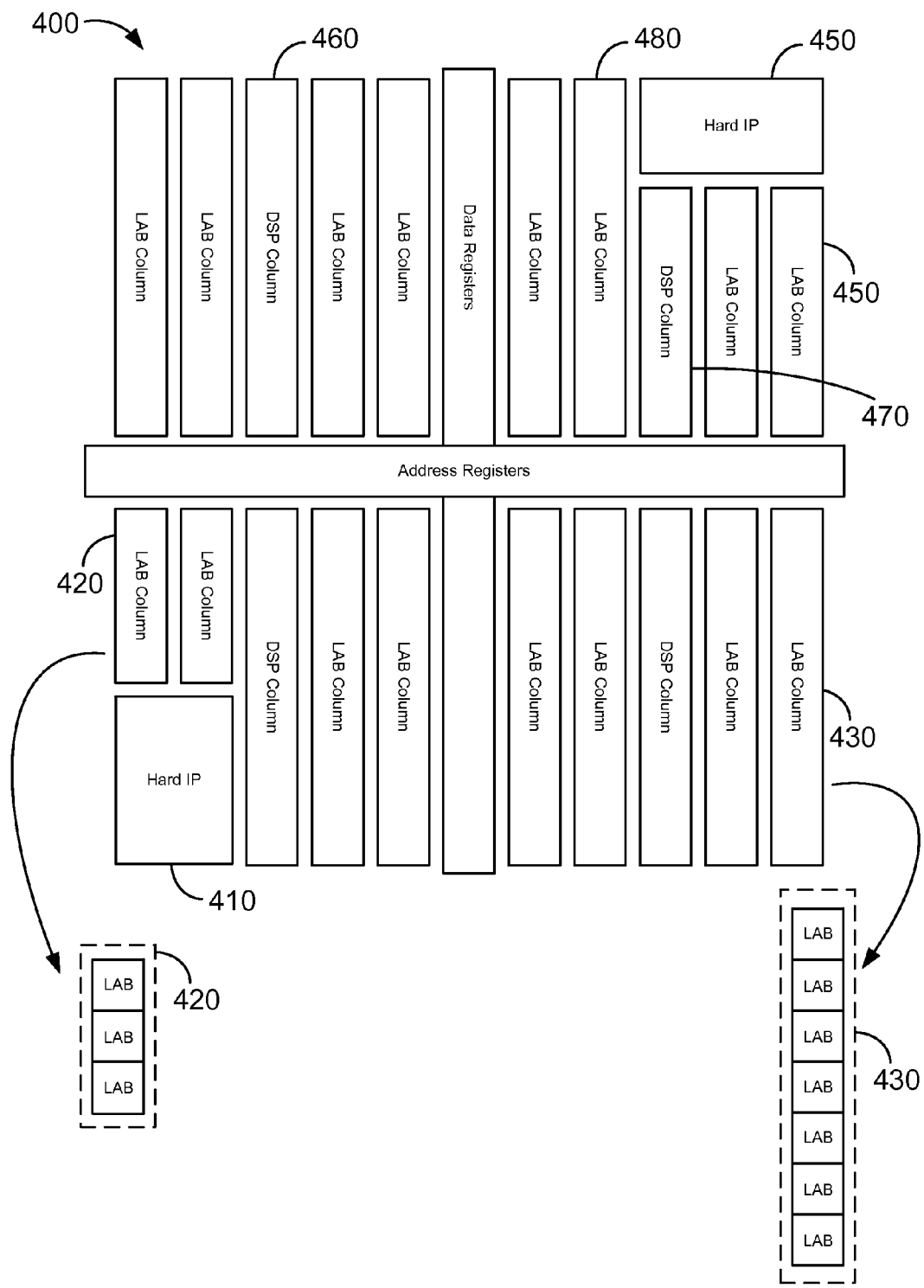
FIG. 4 illustrates an example of Hard IP blocks affecting a distribution of physical configuration elements and resources within a PLD according to an exemplary embodiment.

FIG. 4 is another example of a schematic of a programmable logic device (PLD) that may be configured with a configuration bit stream. In an implementation, PLD 400 also includes a plurality of columns arranged across 2 rows. Each column may contain a certain resource type. For example, in FIG. 4, DSP Column 460 may contain a plurality of resources, each corresponding to a digital signal processing (DSP) module. LAB Column 430 may also contain a plurality of resources, each corresponding to a Logic Array Block (LAB).

PLD 400 may also include Hard Intellectual Property (IP) Block 410 and Hard IP Block 450. Hard IP Blocks 410 and 450 may include a variety of hard, or hardened or hardwired, functionality. For example, Hard IP Blocks 410 and 450 may include microprocessors, controllers for a variety of functions, clocking circuitry, memory interfaces, memory, configuration circuitry, or any other type of circuitry. In any case, Hard IP 410 and 450 are generally fixed functionality, rather than user configurable such as DSP Modules or LAB modules, within the PLD 400. As such, Hard IP 410 and Hard IP 450 may lack user-configurable CRAM cells. Since Hard IP 410 and Hard IP 450 are within the coordinate system provided by the Data Registers and Address Registers, they overlap with address locations, but lack physically existing CRAM cells associated with the address locations.

Additionally, Hard IP Block 410 and Hard IP Block 450 may cause a column to have a difference in the number and/or arrangement of resources compared to another column. In the implementation shown in FIG. 4, Hard IP Block 450 is in the top-right quadrant of PLD 400. Hard IP Block 450 may occupy a certain area of PLD 400, causing DSP Columns and/or LAB Columns to have less DSP Modules or LAB Modules compared to other DSP Columns and LAB Columns. For example, LAB Column 430 may have 7 LAB modules. Likewise, LAB Column 480 may also include 7 LAB modules. However, LAB Column 450 may have a different number and/or arrangement of LAB modules compared to LAB Columns 430 and 460. For example, LAB Column 450 may have 4 rows of LAB modules due to Hard IP Block 450 making use of a certain area of PLD 400 that would otherwise be available to columns, such as LAB Columns or DSP Columns. Likewise, Hard IP Block 410 also makes use of a certain area of PLD 400, causing a column, such as LAB Column 420, to also have a different number and/or arrangement of LAB Modules. In the implementation of FIG. 4, LAB Column 420 may have 3 LAB Modules due to Hard IP Block 410 occupying area of PLD 400.

Thus, a coordinate system of a PLD has more address locations than actual CRAM cells. Additionally, different resource types utilized within the PLD may have different distributions of physical CRAM cells. Moreover, fixed functionality, such as hard IP blocks, may cause a column to have a different number and/or arrangement of resources. As such, a configuration bit stream, which is used to configure a device by indicating how to configure the CRAM cells within the PLD, may include a plurality of bits corresponding to address locations which do not have corresponding physical CRAM cells.

Accordingly, a configuration bit stream may be shortened or reduced such that "phantom bits" which do not correspond to physical CRAM cells may be removed instead of retaining a "dummy" or filler bit.

Figure 5:
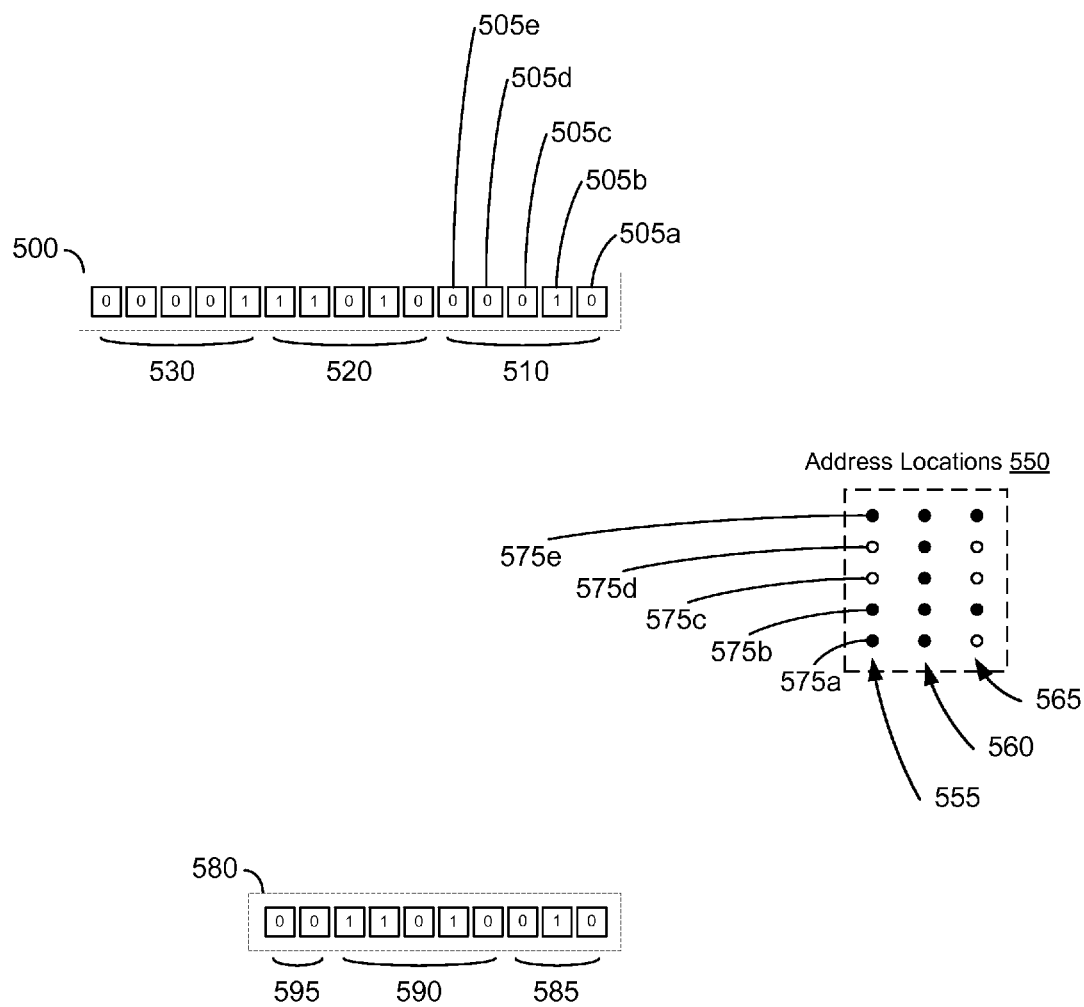
FIG. 5 illustrates an example of removing "phantom bits" from a configuration bit stream according to an exemplary embodiment.

FIG. 5 illustrates an implementation of removing phantom bits from a configuration bit stream which do not correspond to actual physical CRAM cells on a PLD. In FIG. 5, Original Bit Stream 500 may include fifteen bits. The 15 bits of Original Bit Stream 500 may be divided into three groups, 510, 520, and 530. Each of the Groups 510, 520, and 530 may correspond to a particular group of address locations of the PLD. For example, Group 510 may correspond to Addresses 555 of Address Locations 550. Group 520 may correspond to Addresses 560. Moreover, Group 530 may correspond to Addresses 565.

Additionally, each bit within Original Bit Stream 500 corresponds to a particular address location. For example, Bit 505a may correspond with Address 575a. Bit 505b may correspond with Address Location 575b. Bit 505c may correspond with Address Location 575c. Bit 505d may correspond with Address Location 575d. And, Bit 505e may correspond with Address Location 575e. Additionally, Address Locations 575a, 575b, and 575e may correspond to physical CRAM cells. Address locations 575c and 575d may not correspond to physical CRAM cells.

As such, the size of a configuration file may be reduced because bits which do not correspond to physical CRAM cells may be removed from Original Bit Stream 500 because the data at the corresponding locations within Original Bit Stream 500 are not used to configure a CRAM cell. For example, the "0" represented by 505c and the "0" represented by 505d do not configure a physical CRAM cell, and are thus phantom bits. However, the "0" represented by 505a, "1" represented by 505b, and "0" represented by 505e may be used to configure physical CRAM cells.

Accordingly, Reduced Configuration Bit Stream 580 may be generated. Reduced Configuration Bit Stream 580 includes 5 less bits than Original Bit Stream 500 by not retaining the phantom bits. In particular, the bits corresponding to address locations without corresponding physical CRAM cells are missing. For example, for Group 510, bits 505c and 505d are missing because, as previously discussed, Address Locations 575c and 575d do not have corresponding physical CRAM cells and thus, these bits are phantom bits. Accordingly, Group 585 of Reduced Configuration Bit Stream 580 represents the data included in Group 510 of Original Bit Stream 500 that have corresponding physical CRAM cells. Group 590 includes all of the bits of Group 520 because Addresses 560 of the Address Locations 550 has every address location corresponding to a physical CRAM cell. Additionally, Group 595 only has two bits instead of five as represented by Group 530 because Column 565 of Address Locations 550 only has two address locations that correspond with physical CRAM cells.

Figure 6:
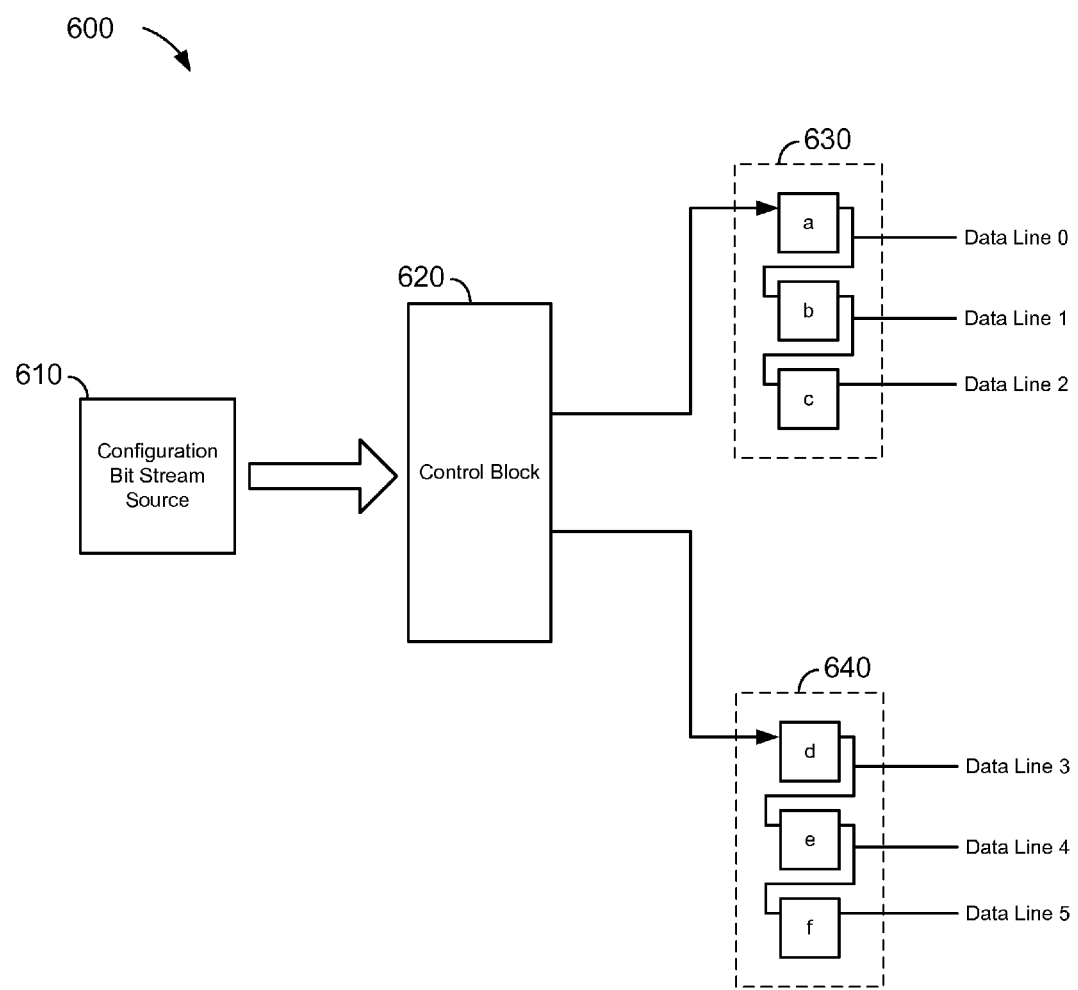
FIG. 6 illustrates an example of a system for loading data from a configuration bit stream into data registers according to an exemplary embodiment.

FIG. 6 shows a schematic of an implementation of a system for loading data from a configuration bit stream into data registers. In FIG. 6, System 600 includes Configuration Bit Stream Source 610, Control Block 620, and Shift Registers 630 and 640. Shift Registers 630 and 640 may form Data Registers used to configure configuration elements within the PLD, as previously discussed. For example, Shift Registers 630 and 640 may be components of Data Registers 110 of FIG. 1.

Configuration Bit Stream Source 610 may provide a configuration bit stream to an input of Control Block 620. Control Block 620 may provide portions of the received configuration bit stream to the first registers (i.e., Registers A and D) of Shift Registers 630 and 640. Shift Registers 630 and 640 may be components of Data Registers 110, and thus each register may drive a data line which is used, in conjunction with address lines (not shown) corresponding to Address Registers, to configure configuration elements within the PLD. For example, an output of Register A of Shift Register 630 drives Data Line 0. Register B drives Data Line 1, and Register C drives Data Line 2. Likewise, the registers of Shift Register 640 also drive data lines. Register D drives Data Line 3, Register E drives Data Line 4, and Register F drives Data Line 5.

In some implementations, portions of the configuration bit stream may be provided to Control Block 620 in parallel. For example, Configuration Bit Stream Source 610 may drive a 32-bit bus as an input to Control Block 620. Control Block 620 may further drive 32 shift registers which compose the Data Registers by providing the data from the received configuration bit stream. In other implementations, Control Block 620 may receive data in a 128-bit bus and provide the data via a 32-bit bus to 32 shift registers forming the data registers. In another implementation, Control Block 620 may receive data from the Configuration Bit Stream Source 610 serially. Accordingly, data from the Configuration Bit Stream Source 610 is received by Control Block 620. Control Block 620 may send portions of the received data to Shift Registers 630 and 640 to be driven on Data Lines 0-5. As such, groups of data (i.e., bits) from the configuration bit stream may be shifted into Shift Registers 630 and 640 and used to configure columns of CRAM cells.

Figure 7:
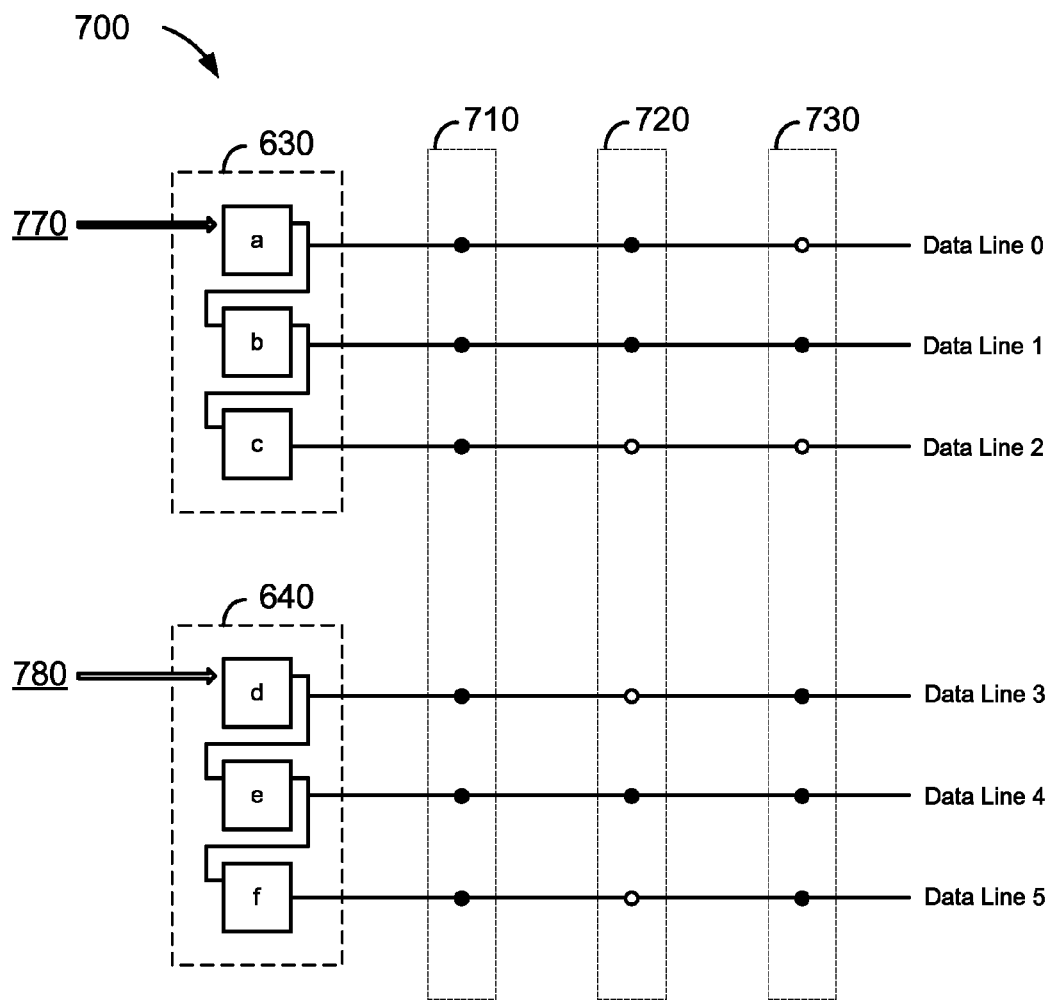
FIG. 7 illustrates an example of a system for configuring columns of configuration elements according to an exemplary embodiment.

FIG. 7 shows a schematic of a system for configuring columns of configuration elements according to an implementation. In FIG. 7, system 700 includes Shift Registers 630 and 640, Inputs 770 and 780, and three columns of CRAM cells: Column 710, Column 720, and Column 730.

In an implementation, Inputs 770 and 780 may be received from Control Block 620. The inputs may be used to load Shift Registers 630 and 640 with the proper data to configure the PLD. For example, Column 710 includes 6 CRAM cells, each represented by a solid circle. Column 720 includes 3 CRAM cells (on Data Lines 0, 1, and 4) and 3 locations which do not have corresponding CRAM cells (on Data Lines 2, 3, and 5), each represented by an empty circle. Column 730 includes 4 CRAM cells (on Data Lines 1, 3, 4, and 5) and 2 locations without corresponding CRAM cells (on Data Lines 0 and 2). Accordingly, a bit stream may be loaded into Shift Registers 630 and 640 such that the CRAM cells of a single column may be configured. In the example of FIG. 7, six bits of a configuration bit stream may be loaded at a time. Accordingly, three bits may be loaded into Shift Register 630 and three bits may be loaded into Shift Register 640. However, a bit stream without phantom bits, such as Reduced Configuration Bit Stream 580 of FIG. 5 may not properly load Shift Registers 630 and 640 because they are of a fixed length (i.e., three bits), number (i.e., two), and/or location (i.e., Shift Register 630 begins at Register A, Shift Register 640 begins at Register D).

For example, Column 710 includes 6 CRAM cells. Six bits of data from the configuration bit stream corresponding to the CRAM cells of Column 710 may be shifted into Shift Registers 630 and 640, each including three bits. Following the loading of the data registers (Shift Registers 630 and 640), an Address Line (not shown) corresponding to Column 710 may be asserted such that the CRAM cells within Column 710 may be configured. Next, Column 720 may be configured. Accordingly, data is also shifted into the data registers composed of Shift Registers 630 and 640. Column 720 includes 3 CRAM cells at locations corresponding to Data Lines 0, 1, and 4 and locations lacking CRAM cells corresponding to Data Lines 2, 3, and 5. Therefore, the first bit shifted into Shift Register 630 may be a "phantom bit," such as a "0" or a "1," in the configuration bit stream which acts as a padding or dummy bit because Register C is not configuring a physical configuration element at Data Line 2 for Column 720 (i.e., the location lacks a CRAM cell). Following three clock cycles, the phantom bit may be loaded into Register C while Registers A and B may be loaded with bits from the configuration bit stream which are meant to configure physical CRAM cells in Column 720 that are driven by Data Lines 0 and 1. Likewise, the data shifted into Shift Register 640 may also include phantom bits from the configuration bit stream. For Column 720, Shift Register 640 may include 2 phantom bits to correspond to the locations on Data Lines 3 and 5. Accordingly, an address line (not shown) corresponding to Column 720 may be asserted such that the CRAM cells within Column 720 may be configured with the values driven on Data Lines 0-5 by Shift Registers 630 and 640. Though Registers C, D, and F are driving Data Lines 2, 3, and 5, respectively, the data is not used to configure a CRAM cell because the data lines for Column 720 do not correspond with a physical CRAM cell. Rather, the CRAM cells driven by Registers A, B, and E on Data Lines 0, 1, and 4, respectively, are configured. Column 730 may also be configured in a similar matter. The portion of the configuration bit stream shifted into Shift Register 630 may include two phantom bits (for Registers A and C) and one bit corresponding to a physical CRAM cell (for Register B). Shift Register 640 may include three bits corresponding to physical CRAM cells (Registers D, E, and F). Thus, six bits from the configuration bit stream are loaded at a time to properly load Shift Registers 630 and 640 and configure the PLD.

However, a configuration bit stream such as Reduced Configuration Bit Stream 580 from FIG. 5 may not load Shift Registers 630 and 640 properly because it has fewer bits due to the removal of phantom bits. For example, a configuration bit stream without phantom bits may only have one bit for the section of Column 720 configured by Shift Register 640 (Data Lines 3-5) rather than three bits for a configuration bit stream with phantom bits. However, because Shift Register 640 is of a fixed length (three bits) and drives Data Lines 3-5 (of which Data Line 4 corresponds to a physical CRAM cell), Shift Register 640 needs three bits to properly load. Accordingly, the bit corresponding to the physical CRAM cell at Data Line 4 may need to be the second of three bits shifted into Shift register 640.

Figure 8:
FIG. 8 illustrates an example of configuring shift registers among available data registers for configuring a PLD with a configuration bit stream without phantom bits.

FIG. 8 shows an implementation of instantiating shift registers among available data registers for configuring a PLD with a configuration bit stream without phantom bits. In FIG. 8, Column 830 includes a column of CRAM cells and locations without CRAM cells on Data Lines 0-11. Data Registers 810 is an implementation of fixed shift registers. Data Registers 810 includes four shift registers. Each register corresponding to a Data Line may be included in one of the four shift registers. Additionally, inputs from a control block may also be fixed. For example, Registers A, D, G, and J of Data Registers 810 receive inputs for each of the four shift registers.

Data Registers 820 is an implementation of dynamic shift registers used to implement data registers for configuring a PLD. Data Registers 820 includes Registers A-L. Each Register may correspond to one of the Data Lines 0-11. However, because Column 830 includes seven locations with CRAM cells (i.e., the locations corresponding to Data Lines 0, 2, 4, 7, 9, 10, and 11), shift registers may be dynamically configured among Registers A-L to form shift registers among the registers corresponding to the seven locations. In other words, shift registers may be instantiated or generated to only include registers which drive CRAM cells. In some implementations, the length (e.g., two bits, three bits), input location (e.g., a shift register receiving input from a control block at a particular register, such as Registers A, E, and J), registers which form the shift register (e.g., Registers A and C forming a shift register while bypassing Register B), and number (e.g., three shift registers) may vary depending upon a distribution of configuration elements (e.g., CRAM cells) within the particular column, such as Column 830. In the example of FIG. 8 and Data Registers 820, shift registers are configured among the available data registers such that there are three shift registers: a first shift register with an input at Register A, a second shift register with an input at Register E, and a third shift register with an input at Register J. Additionally, the first shift register is two bits in length. The second shift register is also two bits in length. The third shift register is three bits in length. Further, each shift register is configured among the available Registers A-L by bypassing registers corresponding to locations or data lines which do not have configuration elements (e.g., CRAM cells) for Column 830. Accordingly, Registers B, D, F, G, and I are skipped when the three shift registers are configured among Registers A-L. Thus, the first shift register beginning at Register A bypasses Register B and includes Register C. The second shift register beginning at Register E bypasses Registers F and G and includes Register H. The third shift register beginning at Register J also includes Registers K and L.

Thus, shift registers may be dynamically configured or generated among the available data registers such that registers corresponding to locations without configuration elements may be skipped. Accordingly, the only data needed in the shift registers may be bits corresponding to the configuration elements. As such, a configuration bit stream without phantom bits, such as Reduced Configuration Bit Stream 580 of FIG. 5, may be used to load data registers and configure a PLD.

Figure 9:
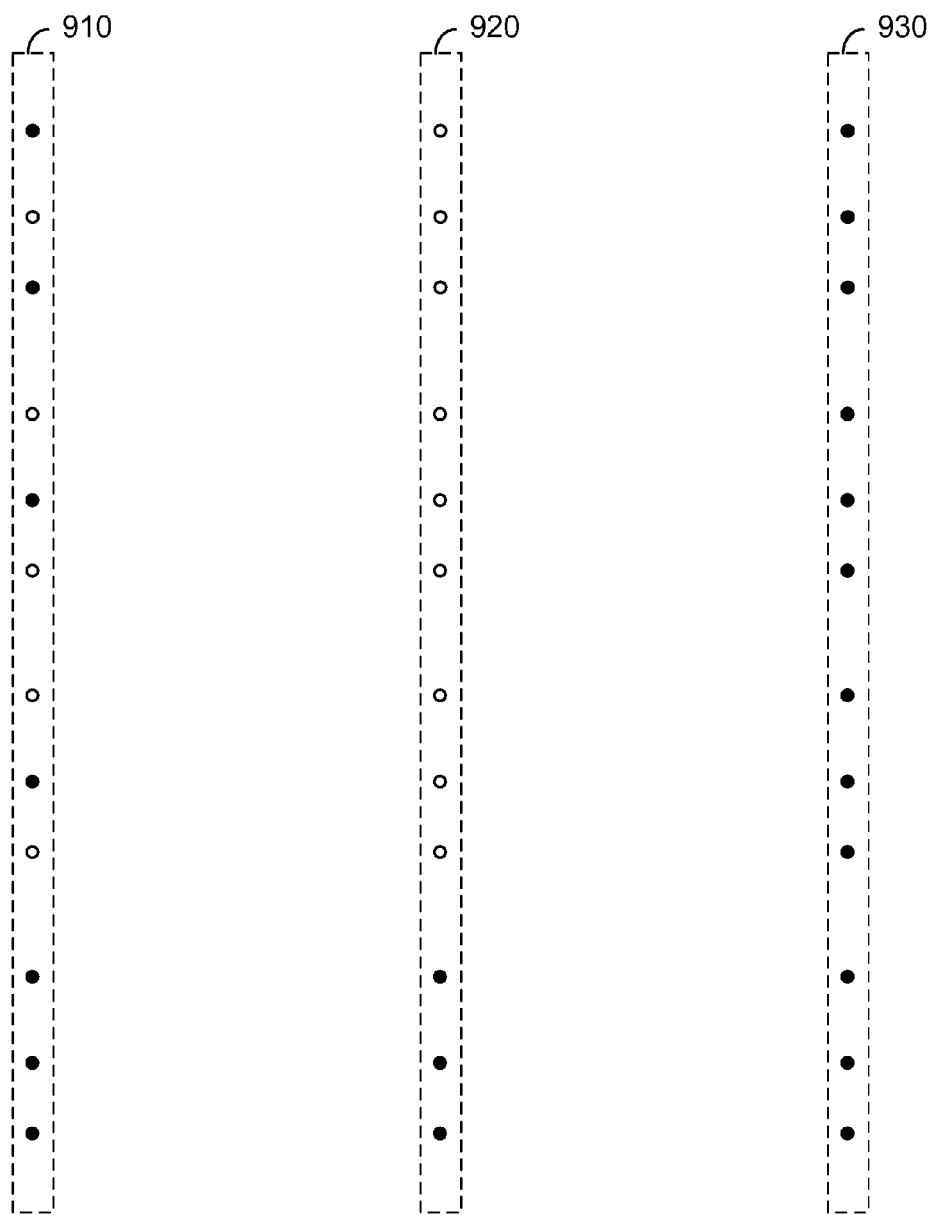
FIG. 9 illustrates examples of columns of configuration elements which may use different configurations of shift registers.

FIG. 9 illustrates examples of columns of configuration elements which may instantiate shift registers with different configurations. Column 910 includes seven CRAM cells and five locations without CRAM cells. In one implementation, three shift registers may be configured among available data registers, as discussed previously with respect to FIG. 8. However, because there are seven CRAM cells and three shift registers, an imbalance in regards to the number of bits per shift register may occur. For example, with seven CRAM cells and three shift registers, two shift registers may be two bits in length and the third shift register may be three bits in length. Accordingly, the three-bit shift register may need an extra clock cycle to fully load compared to the two-bit shift registers. As such, a dummy or filler bit may be shifted into the two bit shift registers in the first clock cycle while the first "real" bit (i.e., a bit that corresponds to a physical CRAM cell) is shifted into the third shift register. Accordingly, the two real bits may be shifted into the two-bit shift registers in the subsequent two clock cycles such that the two real bits populate the two-bit shift registers. In another implementation, shift registers may be configured to respond to load or enable signals. Accordingly, a control block may assert a load or enable signal for the two-bit shift registers after the first clock cycle such that no dummy bit needs to be shifted into the shorter shift registers.

In some implementations, the length of the shift registers may be determined based on the number of CRAM cells within a column to be configured. The number of bits (e.g., seven bits) may be divided by a number of shift registers to be configured (e.g., three) to obtain a result of two with a remainder of one. Accordingly, to make segments as balanced as possible, a single shift register may be three bits whereas two shift registers may be two bits in length. As another example, with 70 bits corresponding to CRAM cells in a column and 32 shift registers, 70 divided by 32 yields 2 with a remainder of 6. Accordingly, 6 out of the 32 shift registers may be 3 bits long while the remaining 26 shift registers may be 2 bits long. As such, a whole number in the division may provide the number of shift registers with one length (e.g., 26 shift registers, each 2-bits in length), while the remainder may provide the number of shift registers with a second length (e.g., 6 shift registers, each 3-bits in length). In other implementations, the instantiations of shift registers may be reversed such that 6 of the 32 shift registers may be 2 bits long while the remaining 26 shift registers may be 3 bits long.

Column 920 is a representation of another column of CRAM cells within a PLD. A configuration of shift registers for Column 920 may differ from Column 910 because of a difference in the distribution of CRAM cells. For example, two shift registers, one 2 bits in length and another 1 bit in length, may be configured to load Column 920. Likewise, Column 930 may also use a different configuration of shift registers among the available data registers. For example, Column 930 may include four shift registers of 3 bits in length each. Accordingly, different columns of CRAM cells may use different configurations of shift registers (i.e., a difference in number of shift registers, locations of shift registers including the input, use of particular registers, and length of shift registers) to properly configure the PLD.

In some implementations, the number of shift registers instantiated among the data registers may be in multiples of two (e.g., 2, 4, 8, 16, 32, etc.). In an implementation, the number of shift registers may be configured such that the configuration time for each column of CRAM cells may be the same. Accordingly, with variable or dynamic numbers of shift registers, one column may utilize 2 shift registers, another column may use 16 shift registers, and so on.

Figure 10:
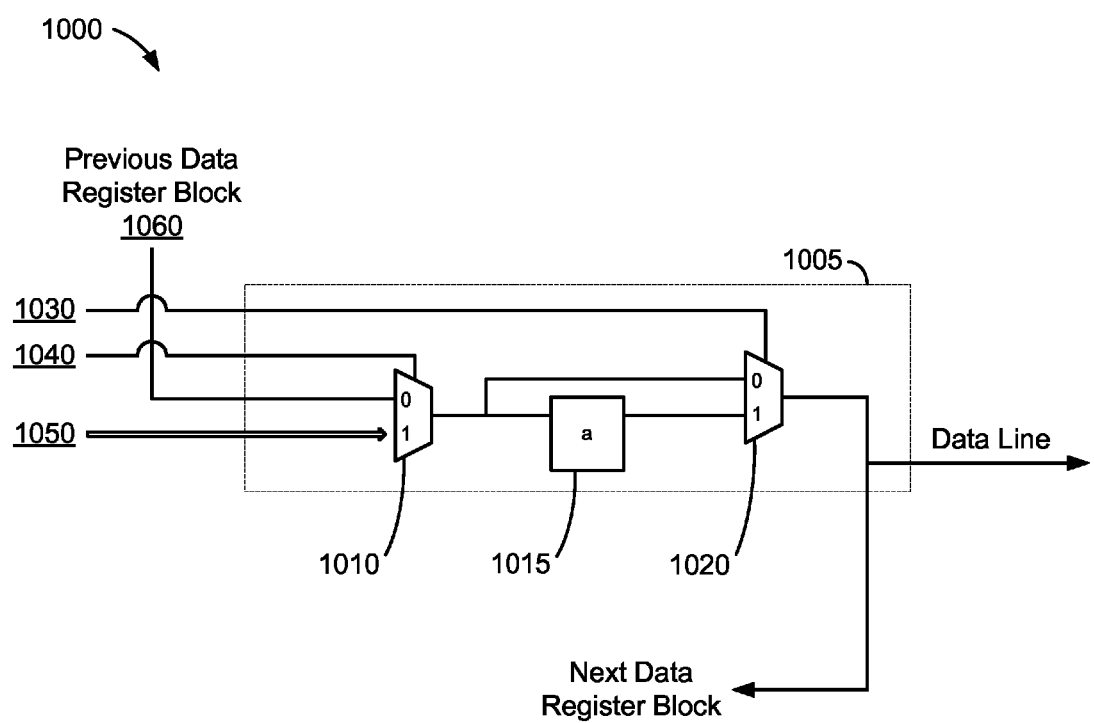
FIG. 10 illustrates an example of a logic design of a data register block according to an exemplary embodiment.

FIG. 10 shows an implementation of a logic design of a data register block which may be used to dynamically generate shift registers according to an exemplary embodiment. In FIG. 10, Data Register Block 1000 includes an Input Multiplexer (Mux) 1010, Register 1015, and Output Mux 1020.

Input Mux 1010 has two data inputs: Configuration Bit Stream Input 1050 and Previous Data Register Block 1060. Configuration Bit Stream Input 1050 may be data, such as bits from a configuration bit stream, from a control block. Previous Data Register Block 1060 may be an output of another Data Register Block. The Select or Control Signal 1040, which is used to determine which input to output, of Input Mux 1010 may also be received from a control block. The output of Input Mux 1010 may be an input to Register 1015 and Output Mux 1020. Additionally, an output of Register 1015 may be another input to Output Mux 1020. Moreover, Output Mux 1020 may also have a select or control signal 1030, which may also be received from a control block according to an implementation. An output of Output Mux 1020 may drive a Data Line as well as be an input to a next Data Register Block (e.g., Input 1060 of another Data Register Block).

Thus, in an implementation, the Data Register Block 1000 may be configured to select either an input from a previous Data Register Block or a Control Block. Additionally, the Output Mux 1020 of the Data Register Block may be configured to select either data from the output of the Input Mux 1010 or Register 1015 to drive onto the Data Line as well as transmit to a next Data Register Block. Accordingly, multiple Data Register Blocks may be used to dynamically configure shift registers.

Figure 11:
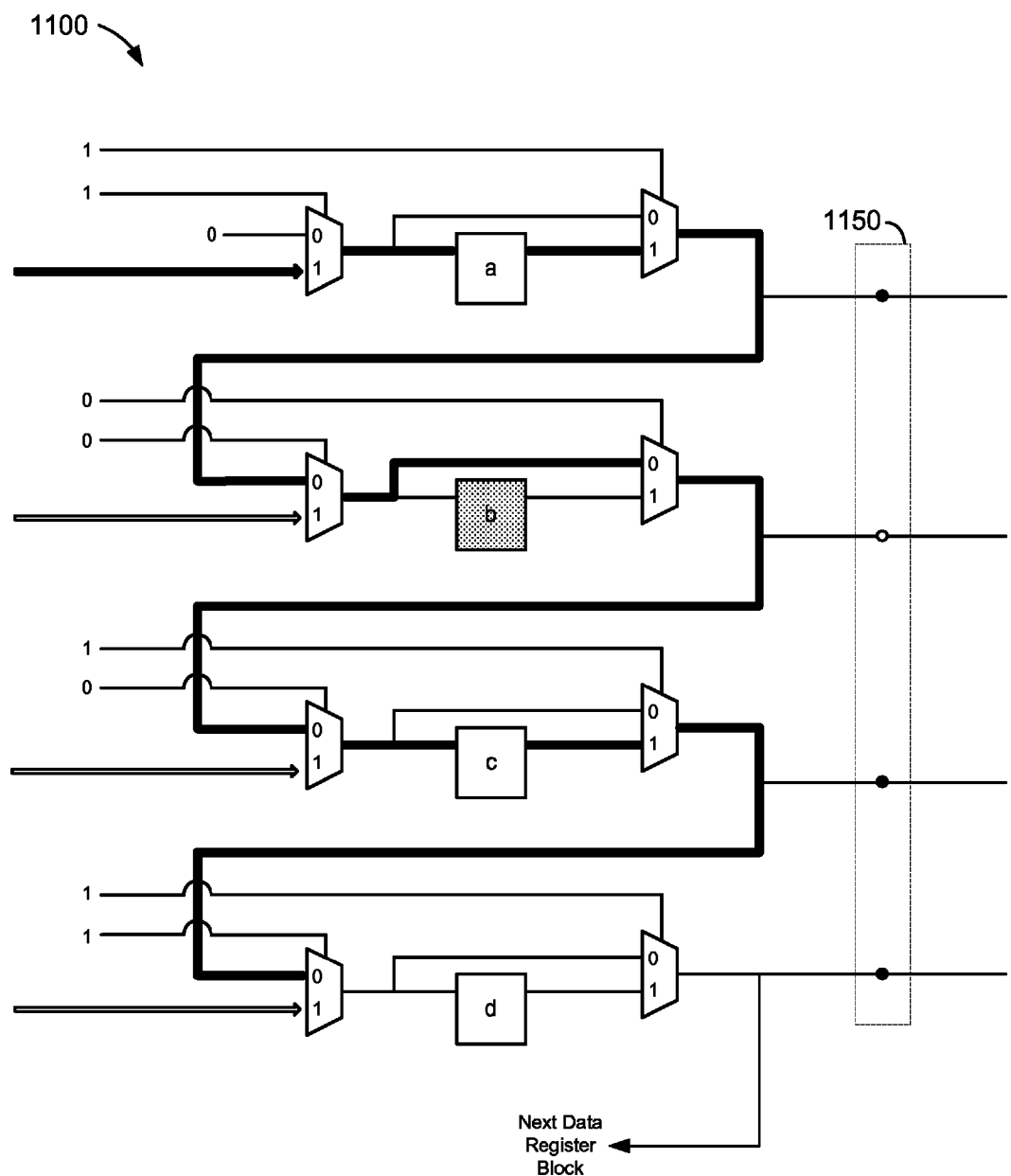
FIG. 11 illustrates an example of a logic design of multiple data register blocks configured as shift registers according to an exemplary embodiment.

For example, FIG. 11 is an implementation of a logic design 1100 of multiple Data Register Blocks configured as shift registers. Logic Design 1100 includes four Data Register Blocks, each with an Input Mux, Output Mux, and Register (A-D). Each Data Register Block corresponds to a Data Line. In the example of FIG. 11, a portion of column 1150 has three locations with CRAM cells (corresponding to Data Register Blocks A, C, and D) and one location without a corresponding CRAM cell (Data Register Block B). In an implementation, 2-bit shift registers may be configured among the registers of the Data Register Blocks. Accordingly, the Data Register Blocks may be configured to create shift registers that skip or bypass registers (e.g., Register B) that do not correspond with a CRAM cell for a particular column.

For example, the control signal to the Input Mux of Register A may be 1 because Register A may be the input of a first shift register to be configured. Accordingly, a data input (e.g., bits from a configuration bit stream) from the control block may be selected. As such, the data input from the control block may be an input to Register A and its Output Mux. However, because the control signal to the Output Mux is 1, the data output of Register A is selected as the output. Accordingly, the output of the Output Mux is used to drive the first Data Line as well as an input of the next Input Mux for Register B. The control signal for the Input Mux for Register B is 0. Accordingly, the output of the first Output Mux is selected as the output of the Input Mux for Register B rather than data from the control block. However, Register B's Output Mux has a control signal of 0. Accordingly, the output of Register B's Output Mux may be the output of Register B's Input Mux. As such, the output of Register B is skipped or bypassed. The output of the Output Mux of Register B is received by the next Data Register Block. For example, Register C's Input Mux receives the output of Register B's Output Mux. Because Register C is the second bit of the first 2-bit shift register, the data from Register B's Output Mux is selected rather than data from the control block. Accordingly, the data is sent to Register C. The Output Mux of Register C has a control signal of 1, selecting the output of Register C. Accordingly, the output of the Output Mux of Register C is used to drive a Data Line as well as go to an Input Mux of Register D. However, because Register D corresponds to a beginning of a new 2-bit shift register, the Input Mux of Register D has a control signal of 1, allowing the data shifted in to be data from the control block rather than Register C. The next register forming the second 2-bit shift may follow a similar process as with Registers B and C (i.e., skipping registers which do not correspond to a location with a physical configuration element until a register which corresponds to a physical configuration element is available). Thus, two 2-bit shift registers were configured among the available registers. Additionally, registers which do not correspond to configuration elements, such as Register B, were skipped from the shift register data paths. As such, a configuration bit stream without phantom bits, such as Reduced Configuration Bit Stream 580 from FIG. 5, may be used to configure a PLD.

As another example, a data path of the first shift register (composed of Registers A and C) is highlighted in FIG. 11. A bit being shifted into the 2-bit shift register may be an input Register B, but the output of Register B is skipped. Thus, the bit may be shifted through Registers A and C while skipping or bypassing Register B. However, the bit is not shifted into Register D because Register D is a separate 2-bit shift register. Thus, a 2-bit shift register composed of Registers A and C may be configured. A separate 2-bit shift register may begin at Register D. Register B has been excluded from the configured shift registers because it does not correspond to a physical CRAM cell for Column 1150. Thus, the CRAM cells of Column 1150 may be configured using a configuration bit stream without phantom bits. Accordingly, different columns of CRAM cells may use different configurations of shift registers (i.e., a difference in number of shift registers, input locations of shift registers, use of particular registers, and length of shift registers) to properly configure the PLD.

Figure 12:
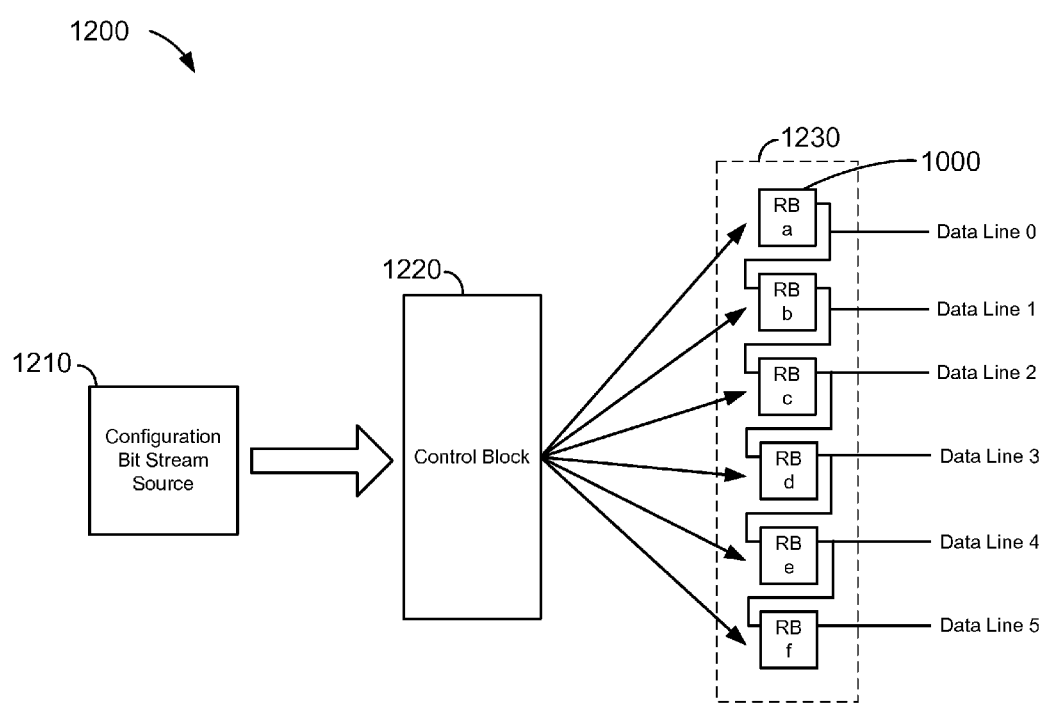
FIG. 12 illustrates an example of a system for loading data from a configuration bit stream without phantom bits into data register blocks configured as shift registers according to an exemplary embodiment.

FIG. 12 is an implementation of a system for loading data from a configuration bit stream without phantom bits into Data Register Blocks configured as shift registers. In FIG. 12, System 1200 includes Configuration Bit Stream Source 1210, Control Block 1220, and Data Registers 1230. Data Registers 1230 include a plurality of Data Register Blocks 1000 which may be configured as shift registers, as previously discussed.

Configuration Bit Stream Source 1210 may provide a configuration bit stream to an input of Control Block 1220. Control Block 1220 may have a data input to every Data Register Block (RB A-F), as well as control signals to the input and output muxes, as previously discussed. Additionally, every data register block may be chained together (e.g., the data from an output mux may be an input to the next block's input mux), as previously discussed. The outputs of each output mux may also drive a data line. For example, an output of RB A drives Data Line 0. RB B drives Data Line 1, RB C drives Data Line 2, RB D drives Data Line 3, RB E drives Data Line 4, and RB F drives Data Line 5.

In some implementations, portions of the configuration bit stream may be provided to Control Block 1220 in parallel. For example, Configuration Bit Stream Source 1210 may drive a 32-bit bus as an input to Control Block 1220. Control Block 1220 may further drive 32 shift registers which compose the Data Registers by providing the data from the received configuration bit stream. In other implementations, Control Block 1220 may receive data in a 128-bit bus and provide the data via a 32-bit bus to 32 shift registers forming the data registers. In another implementation, Control Block 1220 may receive data from the Configuration Bit Stream Source 1210 serially. Accordingly, data from the Configuration Bit Stream Source 610 is received by Control Block 620. Control Block 1220 may send portions of the received data to Data Registers 1230. Additionally, Control Block 1220 may output control signals to the input and output muxes of each Register Block. As such, groups of data (i.e., bits) from the configuration bit stream may be shifted into Data Registers 1230 and used to configure columns of CRAM cells.

In other implementations, the control signals may be set by configured CRAM cells. For example, each control or select line of the input and output muxes may be tied high or low by configured CRAM cells.

Figure 13:
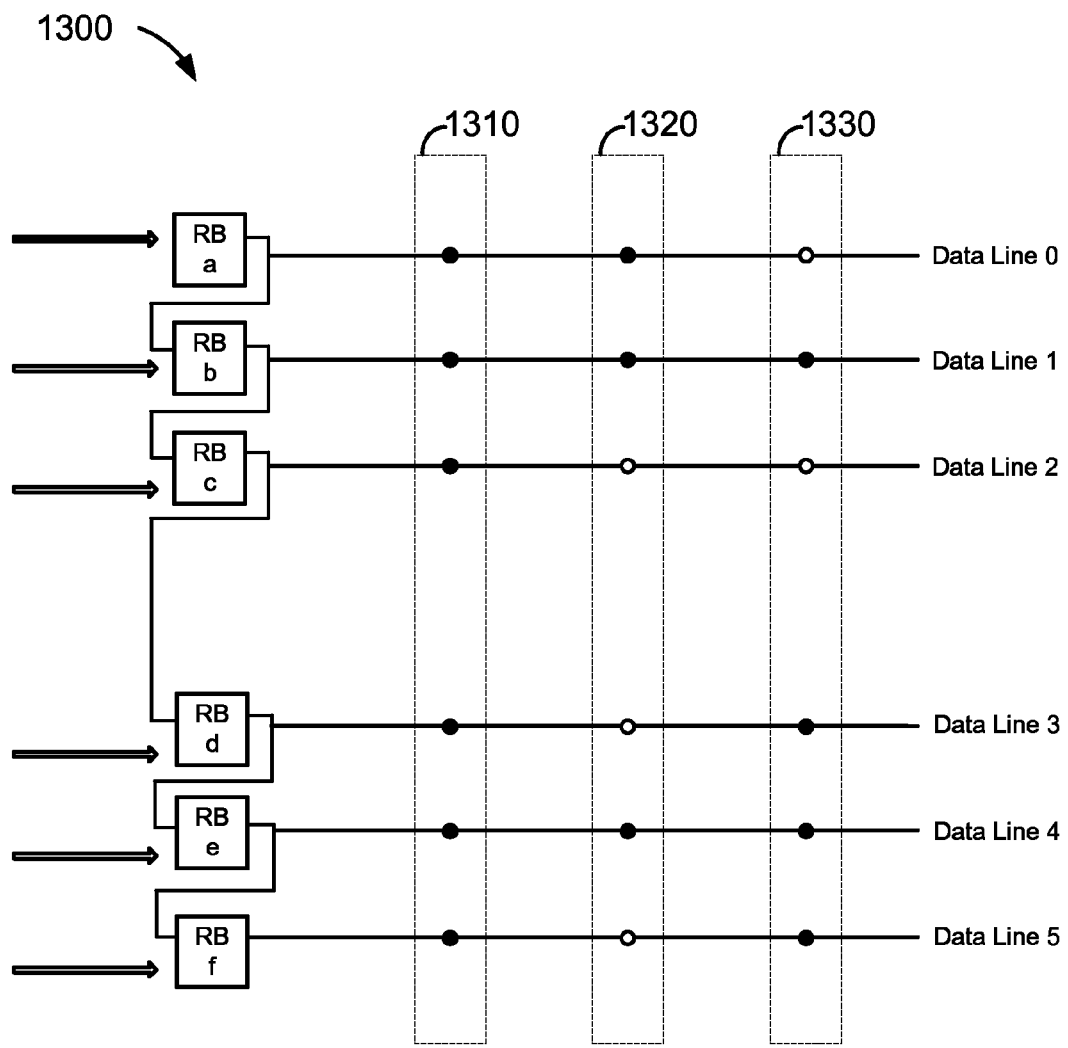
FIG. 13 illustrates another example of a system for configuring columns of configuration elements according to an exemplary embodiment.

FIG. 13 shows a schematic of a system for configuring columns of configuration elements according to an implementation. In FIG. 13, system 1300 includes Data Register Blocks A-F and three columns of CRAM cells: Column 710, Column 720, and Column 730.

In an implementation, shift registers may be dynamically configured among RB A-F based on a distribution of CRAM cells of Columns 710-730. For example, Column 710 includes 6 CRAM cells, each represented by a solid circle. Column 720 includes 3 CRAM cells (on Data Lines 0, 1, and 4) and 3 locations which do not have corresponding CRAM cells (on Data Lines 2, 3, and 5), each represented by an empty circle. Column 730 includes 4 CRAM cells (on Data Lines 1, 3, 4, and 5) and 2 locations without corresponding CRAM cells (on Data Lines 0 and 2). Accordingly, when configuring a column of CRAM cells, Control Block 1220 may configure RB A-F such that the number, location, use of particular registers, and length of the shift registers vary based on the column of CRAM cells. For example, if Column 1330 is being configured, RB A-F may be dynamically configured. In an implementation, RB A-F may be configured to include 2 2-bit shift registers, one shift register including RB B and RB D and a second shift register including RB E and RB F. If configuring Column 1310, in an implementation, three 2-bit shift registers may be dynamically configured among RB A-F. For example, RB A and RB B may be a first shift register, RB C and RB D may be a second shift register, and RB E and RB F may be a third shift register. Accordingly, RB A-F may be dynamically configured to include shift registers based on the distribution of configuration elements (e.g., CRAM cells) of a column.

Figure 14A:
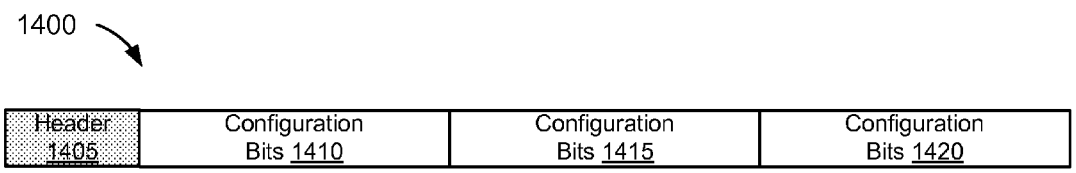
FIG. 14A illustrates one example of including design information of a PLD in a header portion of a configuration bit stream according to an exemplary embodiment.

FIG. 14A illustrates one implementation of including design information of a PLD in a header portion of a configuration bit stream. For example, in FIG. 14A, Configuration Bit Stream 1400 includes Header 1405 and Configuration Bits 1410, 1415, and 1420. Header 1405 may include a variety of data, including information for a control block to determine how to dynamically configure the Register Data Blocks forming the Data Registers. In the implementation of FIG. 14A, each of Configuration Bits 1410, 1415, and 1420 may be of the same length.

Figure 14B:
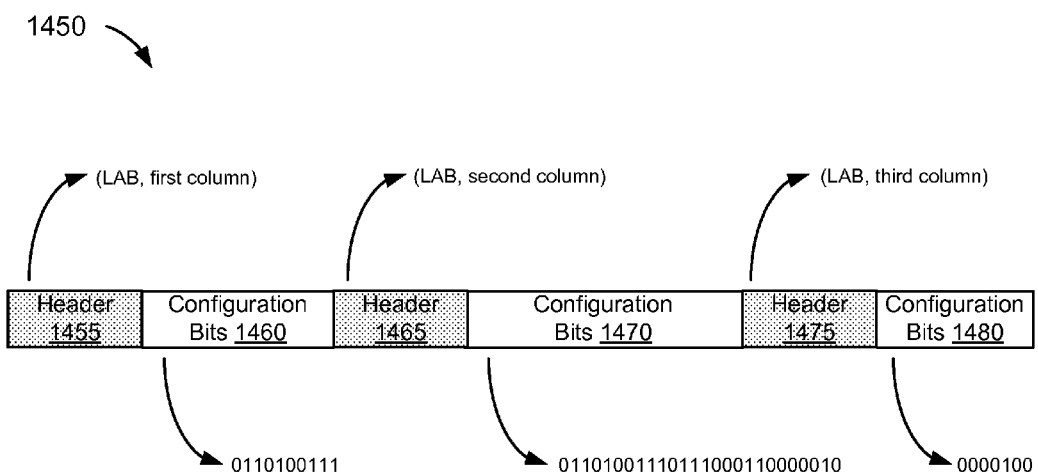
FIG. 14B illustrates another example of including design information of a PLD in a header portion of a configuration bit stream according to an exemplary embodiment.

FIG. 14B illustrates another implementation of including design information of a PLD in a header portion of a configuration bit stream. For example, in FIG. 14B, Configuration Bit Stream 1450 includes three Headers (1455, 1465, and 1475) and three Configuration Bits (1460, 1470, and 1480). The header sections may also include a variety of data, including information for a control block to determine how to dynamically configure the Register Data Blocks forming the Data Registers. In the implementation of FIG. 14B, each header section may include information regarding the configuration bits following the header. For example, Header 1455 may include information regarding Configuration Bits 1460. Header 1465 may include information regarding Configuration Bits 1470. Header 1475 may include information regarding Configuration Bits 1480. The headers may include information such as the type of module (e.g., LAB or DSP) and the particular column of CRAM cells within the module (e.g., the first column of CRAM cells within a LAB) that the following configuration bits correspond to. Accordingly, when the header portion is received by the control block, the information may be read. The control block may determine information regarding the following configuration bits (e.g., that the following bits correspond to a first column of CRAM cells within a LAB module). The control block may also obtain information, either from a header section of a configuration bit stream or from within the PLD itself (e.g., hardcoded in the control block or elsewhere in the PLD, or accessed from memory), regarding the distribution of phantom bits for the particular type of module (e.g., a LAB). In other implementations, information regarding a distribution of bits corresponding to physical configuration elements may be obtained. Accordingly, the Data Registers Blocks forming the Data Registers may be dynamically configured such that the following configuration bits may be properly loaded and configure the PLD.

For example, Header 1455 of Configuration Bit Stream 1450 may be read by the control block. Header 1455 may specify that the following configuration bits correspond to a first column of CRAM cells of a LAB module. The control block may then obtain information regarding the distribution of phantom bits within a LAB. For instance, bits 2, 8, and 10 may be indicated as phantom bits. The control block may also determine the total number of phantom bits or physical bits. As such, registers which do not correspond to physical configuration elements may be skipped when configuring the shift registers. Additionally, the control block may also configure the Data Register Blocks by asserting the proper control signals and data inputs such that shift registers of a particular length, location, and number are configured. Configuration Bits 1460 may then be loaded into the configured shift registers.

In some implementations, Configuration Bits 1460, 1470, and 1480 may be of different lengths because phantom bits are missing from Configuration Bit Stream 1450. Accordingly, the shift registers may be dynamically configured for each column.

In an implementation, a header section may also include information regarding the distribution of phantom bits corresponding to the following configuration bits. In other implementations, a first header section may include the distribution of phantom bits for all types of resources (e.g., LAB, DSP modules) which may be stored by the control block. In other implementations, the header sections may indicate that the following configuration bits are a new column, but all of the design information, such as the resource type, column number, and distribution of phantom bits may be hardcoded or stored in the PLD.

Figure 15:
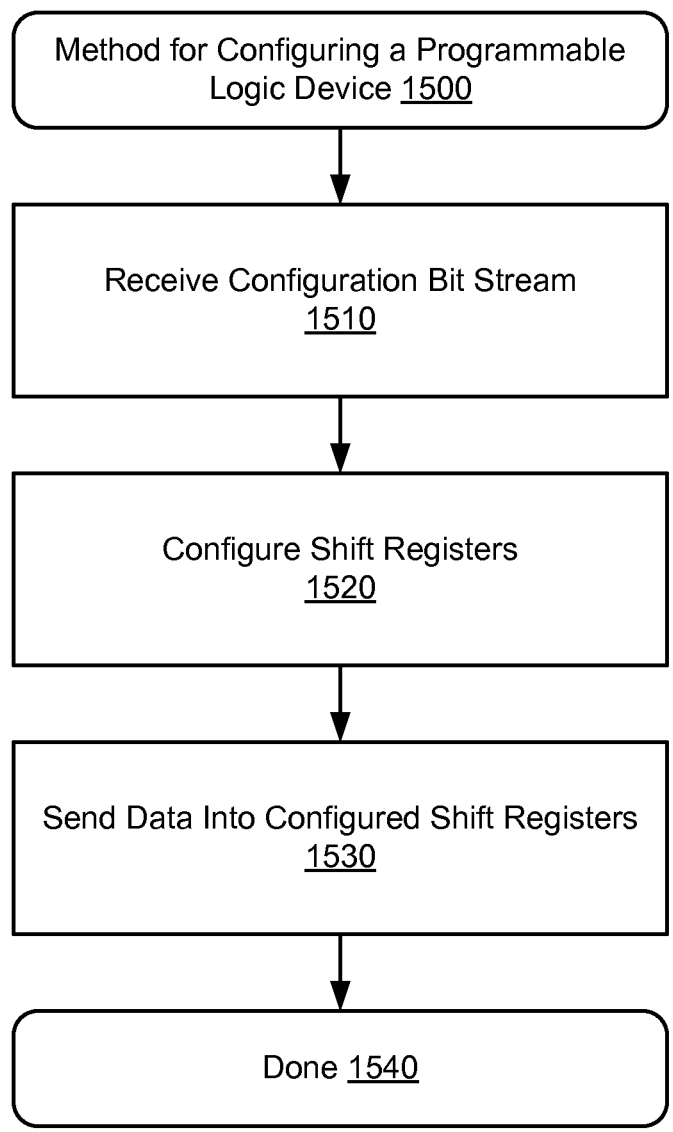
FIG. 15 is a flowchart illustrating a process flow for configuring data registers to program a programmable logic device with a configuration bit stream without phantom bits according to an exemplary embodiment.

FIG. 15 shows a flowchart of an example of a method for configuring data registers to program a programmable logic device with a configuration bit stream without phantom bits. In method 1500, a configuration bit stream may be received at Block 1510. For example, a reduced configuration bit stream (i.e., a bit stream without phantom bits such as Reduced Configuration Bit Stream 580 of FIG. 5), may be received by a control block. Accordingly, at Block 1520, shift registers may be dynamically configured among registers within Data Register Blocks. At Block 1530, data may be shifted into the configured shift registers. At Block 1540, the method is done.

Figure 16:
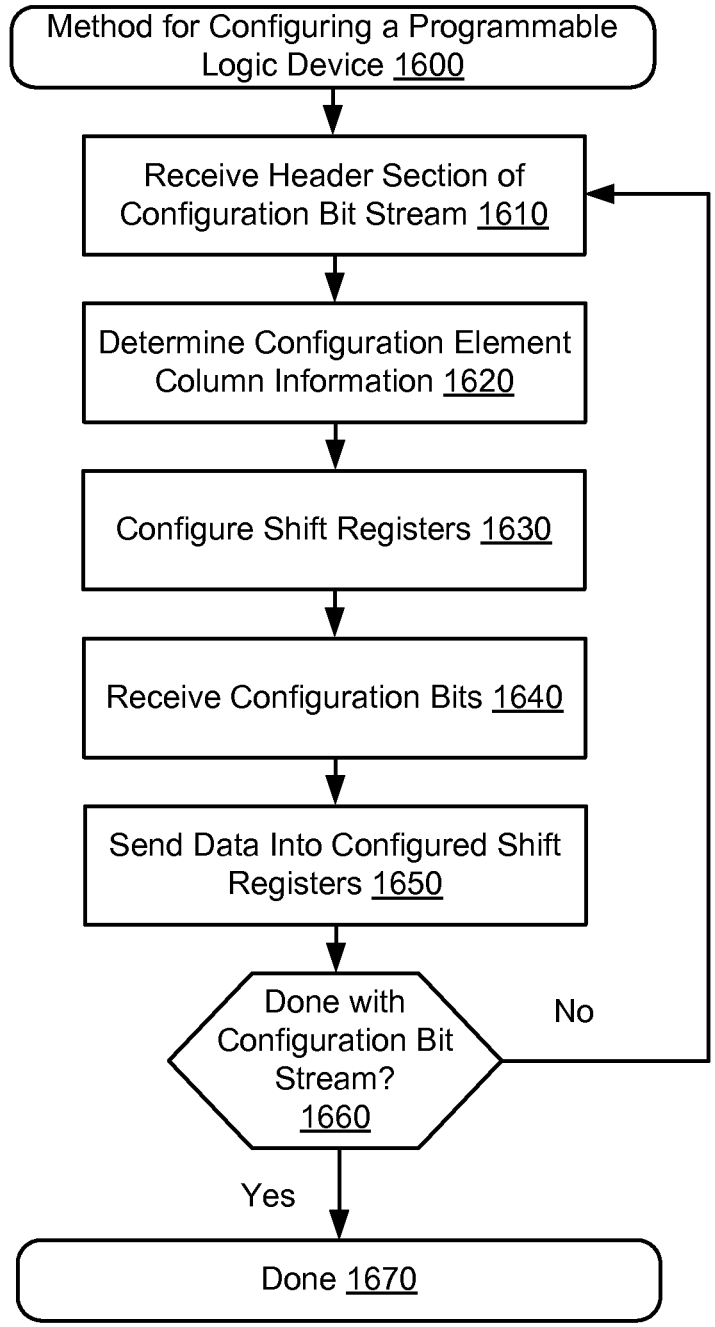
FIG. 16 is another flowchart illustrating a process flow for configuring data registers to program a programmable logic device with a configuration bit stream without phantom bits according to an exemplary embodiment.

FIG. 16 shows another flowchart of an example of a method for configuring data registers to program a programmable logic device with a configuration bit stream without phantom bits. In method 1600, a header section of a configuration bit stream may be received. As previously discussed, the header section may include information regarding the following configuration bits. The information may be read by a control block. For example, the information may include a resource type (e.g., LAB) and a column number (e.g., the first column of CRAM cells within the LAB). Accordingly, the control block may determine a distribution of configuration elements for the following configuration bits (e.g., the first column of CRAM cells within a LAB). At Block 1630, shift registers may be configured. As previously discussed, the shift registers may be dynamically configured with varying lengths, locations, and numbers such that the PLD may be programmed with a configuration bit stream without phantom bits. As such, registers corresponding to a location without a corresponding configuration element may be skipped. At Block 1640, configuration bits to load into the configured shift registers may be received. At Block 1650, the configuration bits may be loaded into the configured shift registers. Accordingly, the data to configure a column of configuration elements such as CRAM cells may be loaded and the column may be configured according to the data in the configured shift registers. At Block 1660, a determination is made as to whether the configuration bit stream is finished. If there is more data, then the next header section is read at Block 1610. If the configuration bit stream is finished, then method is done at Block 1600 because all of the columns of the PLD have been configured.

Configuring shift registers among available Data Register Blocks may be used in applications beyond configuring a PLD. Any application with uses for dynamically configured shift registers may use the techniques disclosed herein.

What is claimed is:

1. A method for configuring a configurable circuit, the method comprising:
   receiving on the configurable circuit data from a configuration bit stream, the data including a first portion and a second portion;
   instantiating on the configurable circuit a first shift register among a plurality of registers, wherein a data path of the first shift register bypasses a register corresponding to a location in the configurable circuit without a configuration element;
   instantiating on the configurable circuit a second shift register among the plurality of registers; and
   sending on the configurable circuit the first portion of the data from the configuration bit stream into the first shift register and the second portion of the data from the configuration bit stream into the second shift register.

2. The method of claim 1, wherein an input to a first register of the first shift register is an output of a first multiplexer, the first multiplexer configured to output data obtained from the configuration bit stream.

3. The method of claim 1, wherein registers among the plurality of registers of the first shift register correspond to locations in the configurable circuit with configuration elements.

4. The method of claim 1 further comprising reading header information of the configuration bit stream.

5. The method of claim 4, wherein the header information is used to instantiate the first shift register and the second shift register.

6. The method of claim 4, wherein the header information includes a resource type and a column number of configuration elements corresponding to the resource type.

7. The method of claim 1, wherein a control block instantiates the first shift register by determining a distribution of locations without corresponding configuration elements.

8. The method of claim 1, wherein the first portion corresponds to a different instantiation than the second portion.

9. The method of claim 1, wherein instantiating the first shift register includes determining a length of the first shift register.

10. A circuit for configuring a configurable circuit, the circuit comprising:
    an input, the input configured to receive data from a configuration bit stream;
    a control block, the control block configured to instantiate a first shift register among a plurality of registers and a second shift register among the plurality of registers, wherein a data path of the first shift register is configured to bypass a register corresponding to a location in the configurable circuit without a configuration element; and
    an output, the output configured to send the data from the configuration bit stream into the first shift register and the second shift register.

11. The circuit of claim 10, wherein an input to a first register of the first shift register is an output of a first multiplexer, the first multiplexer configured to output data obtained from the configuration bit stream.

12. The circuit of claim 10, wherein registers among the plurality of registers of the first shift register correspond to locations in the configurable circuit with configuration elements.

13. The circuit of claim 10, wherein the control block is configured to read header information of the configuration bit stream.

14. The circuit of claim 10, wherein the header information is used to instantiate the first shift register and the second shift register.

15. The circuit of claim 10, wherein the control block is configured to instantiate the first shift register by determining a distribution of locations without corresponding configuration elements.

16. The circuit of claim 10, wherein the first portion corresponds to a different instantiation than the second portion.

17. The circuit of claim 10, wherein the control block is configured to instantiate the first shift register by determining a length of the first shift register.

18. A circuit for configuring a configurable circuit, the circuit comprising:
    means for receiving data from a configuration bit stream;
    means for instantiating a first shift register among a plurality of registers, wherein a data path of the first shift register is configured to bypass a register corresponding to a location in the configurable circuit without a configuration element;
    means for instantiating a second shift register among the plurality of registers; and
    means for sending the data from the configuration bit stream into the first shift register and the second shift register.

* * * * *